United States Patent
Olson

[11] Patent Number: 5,891,522
[45] Date of Patent: Apr. 6, 1999

[54] COMPOSITE ARTICLE WITH ADHERENT CVD DIAMOND COATING AND METHOD OF MAKING

[75] Inventor: James M. Olson, Londonderry, N.H.

[73] Assignee: Saint-Gobain Industrial Ceramics, Inc., Worcester, Mass.

[21] Appl. No.: 963,095

[22] Filed: Nov. 3, 1997

Related U.S. Application Data

[63] Continuation-in-part of Ser. No. 819,557, Mar. 14, 1997, which is a continuation of Ser. No. 449,831, May 24, 1995, Pat. No. 5,674,620.

[51] Int. Cl.$^6$ .................................................. H05H 1/00
[52] U.S. Cl. ..................... 427/309; 427/314; 427/457; 427/532; 427/533; 427/534; 427/535; 427/540; 427/569; 427/573; 427/577
[58] Field of Search .................... 427/309, 314, 427/457, 532, 533, 534, 540, 569, 573, 577

[56] References Cited

U.S. PATENT DOCUMENTS

| | | | |
|---|---|---|---|
| 4,731,296 | 3/1988 | Kikuchi et al. | 428/698 |
| 4,777,336 | 10/1988 | Asmussen | 219/10.55 |
| 4,988,421 | 1/1991 | Drawl et al. | 427/249 |
| 5,173,089 | 12/1992 | Tanabe et al. | 51/309 |
| 5,204,167 | 4/1993 | Saijo et al. | 428/212 |
| 5,236,740 | 8/1993 | Peters et al. | 427/249 |
| 5,415,674 | 5/1995 | Feistritzer et al. | 51/293 |
| 5,585,176 | 12/1996 | Grab et al. | 428/336 |
| 5,648,119 | 7/1997 | Grab et al. | 428/565 |
| 5,701,578 | 12/1997 | Li | 428/565 |

FOREIGN PATENT DOCUMENTS

| 519587 | 2/1992 | European Pat. Off. . |
|---|---|---|

OTHER PUBLICATIONS

R. Haubner, A. Lindlbauer and B. Lux; "Diamond Deposition on Chromium, Cobalt and Nickel Substrates by Microwave Plasma Chemical Vapour Deposition"; Diamond and Related Materials, 2(1993) 1505–1515.

Sigred Kukelka, Roland Haubner, Benno Lux; "Chemical Interactions of WE/CO Hard Metal Substrates with Low Pressure Diamond Coatings"; Presented at Diamond Films'93, Sep. 2–24, 1993, pp. 1/13.

B.S. Park, Y.J. Baik, K.R.Lee, K.Y. Eun, D.H. Kim;, "Behavior of CO Binder Phase During Diamond Eposition on WC–CO Substrate"; Diamond and Related Material, 1(1993) 910–917.

Primary Examiner—Archene Turner
Attorney, Agent, or Firm—Volker R. Ulbrich

[57] ABSTRACT

A process for coating a tungsten carbide base material substrate with CVD diamond film includes carburization and gas-assisted vaporization of cobalt from the surface with simultaneous recrystallization of surface grains of tungsten carbide to change their stoichiometry for improved adherence.

Also disclosed is a WC-Co cutting tool having a relatively fine WC grain size and coated with adherent CVD diamond.

18 Claims, 1 Drawing Sheet

COMPOSITE ARTICLE WITH ADHERENT CVD DIAMOND COATING AND METHOD OF MAKING

CROSS REFERENCE TO RELATED APPLICATIONS

The present application is a continuation-in-part of copending application Ser. No. 08/819,557, filed Mar. 14, 1997 now allowed and hereby incorporated by reference herein, which is a continuation of application Ser. No. 08/449,831 filed May 24, 1995, now U.S. Pat. No. 5,674, 620.

FIELD OF THE INVENTION

The invention relates to composite articles which are coated with diamond and more specifically to cutting tools made of cemented carbide which are coated with diamond by chemical vapor deposition (CVD).

BACKGROUND OF THE INVENTION

Several properties of diamond, such as its hardness and thermal conductivity, make it highly desirable for use as a coating or thin-film applied to articles whose life is limited by excessive wear, such as cutting tools. However, because diamond is a brittle material, in the form of a monolith it does not have the toughness of other traditional cutting tool materials, such as tungsten carbide or PDC (polycrystalline diamond compact). Toughness is especially important to the performance of cutting tool materials in environments where impulsive or high impact forces may be involved, for example in interrupted cutting. The use of diamond as a thin-film, or coating, takes advantage of the wear resistant properties of the thin-film while also taking advantage of the bulk properties (toughness) of an underlying substrate base material. However, in order to reduce this goal to practice, the adhesion strength of the diamond film to the underlying substrate must allow the thin-film and substrate to operate as a "composite" system. This may be particularly challenging for some base materials due to thermal expansion mismatch between the film and substrate which gives rise to very large residual stresses. In addition, the chemical composition of some base materials can impair or prevent the formation of strong bonds between the film and substrate. Ignoring these effects can lead to very weak bonding and may result in delamination of the film or coating from the base material of the substrate during use.

One of the most important base materials for various kinds of flat and rotary cutting tools is cemented carbide, such as tungsten carbide (WC) ceramic particles sintered in a matrix of cobalt (Co) binder. The utility of this class of materials is based upon the combination of a hard, abrasive phase (WC grains) which is cemented or bonded by a metal, ductile phase (Co binder). While the metal binder phase gives the cemented carbide toughness, it is this constituent which is primarily responsible for the difficulties encountered in establishing adhesion to CVD diamond films. Under typical conditions of CVD diamond synthesis, the binder phase of cemented carbides, which is commonly cobalt, but may also be iron or nickel, may interact with the gaseous CVD diamond growth species and catalyze the formation of graphitic material instead of or in addition to diamond. The formation of a graphitic layer on the substrate results in poor adhesion between the film and substrate. In addition, during the chemical vapor deposition of diamond films, the binder phase may dissolve the diamond substrate interface, thereby reducing the interfacial contact area between the film and substrate to degrade mechanical bonding. Finally, the mismatch in thermal expansion between the diamond film and substrate typically results in large residual stresses in the diamond film following deposition which further challenges the interface integrity.

Early efforts to improve the adhesion of diamond films to WC-Co materials led researchers to remove cobalt from the surface of WC-Co materials using several techniques. In U.S. Pat. No. 4,731,296, Kikuchi et al. discuss the formation of an "etch layer" with reduced cobalt concentration extending to between 0.1 to 1.0 micrometers (micrometers) into a WC-Co based substrate with 1–4 wt % (weight percent) Co. This method encourages the nucleation and growth of diamond films without the preferential deposition of graphite. However, methods based on the chemical removal of the binder phase have several drawbacks which can influence the utility of the diamond coated article. Removal of the binder phase to a depth which is greater than the general size dimension of the free surface grains results in the formation of an embrittled layer at the surface of the WC-Co article. In the presence of an applied stress, such as the residual stresses imposed on the diamond film following deposition or those encountered during use of the article, failure of the interface by loss of WC grain cohesion or by crack extension in this embrittled area results in delamination. On the other hand, removal of the binder phase to a depth which is less than the general size dimension of the free surface WC grains usually results in interaction between the diamond and binder phase unless a physical barrier to diffusion across the interface is created. Furthermore, these approaches do not have a means of producing a mechanically tough, interfacial crack deflection mechanism which is necessary to provide the interfacial fracture toughness required for the abrasive applications of metal cutting.

Other researchers have recognized that a physical barrier or so-called "diffusion barrier" to diamond/binder interaction may improve adhesion by preventing interaction between the binder phase and the diamond film. Proper selection of such a layer may also reduce residual stresses between the diamond film and the underlying substrate by selection of an interlayer material having a coefficient of thermal expansion with a value between those of the film and underlying substrate. However, the interlayer approach is not preferred because it is complicated, expensive, and does not result in the increase in interfacial toughness which other techniques achieve.

The U.S. Pat. No. 5,415, 674 issued to Feistritzer et al. discloses a technique to vaporize and re-crystallize surface WC grains. This process is a significant improvement over methods which produce a sub-surface binder-depleted region. However, this process is carried out at a temperature too low for rapid grain growth of the free surface WC grains. There is no discussion of the important details of free surface chemical composition or structural features of the free surface of the WC-Co which are necessary for adhesion of the diamond film under abrasive conditions as described above.

The U.S. Pat. No. 5,100,703 issued to Saijo discloses a process for treating WC-Co having a binder phase of 4 wt % (weight percent) or less by using a decarburizing gas comprised of oxygen and hydrogen between a temperature of 500 and 1200 C. (centigrade). While decarburization of the free surface WC grains promotes re-carburization during CVD diamond deposition and thus promotes chemical bonding between the diamond film and substrate, the method disclosed in this patent results in a free surface in which the WC grains are smaller than the WC grains in the bulk. This process therefore does not contain the crack deflection or interfacial toughening mechanism essential for highly abrasive applications.

The U.S. Pat. No. 5,648,119 issued to Grab et al. discloses the formation of a roughened substrate to improve the "mechanical component of adhesion". However, the excessive roughness of the surface described limits the utility of the diamond-coated article by resulting also in a rough surface for the diamond coating.

There is a need for a process for coating a cemented carbide article with a strongly adherent diamond film by which both the mechanical and chemical components of bonding are optimized, while at the same time the structural characteristics of the interface are designed to maximize crack deflection phenomena.

SUMMARY OF THE INVENTION

In accordance with the novel process of the present invention, a cemented carbide article has its surface treated at an elevated temperature and in an acitivated gas environment to remove some binder from the surface region, while at the same time carburizing a surface depth region of the binder remaining between exposed surface particulates. Simultaneously with the removal of binder, the particulates grow in size and undergo a change in the stoichiometry of their free surface region, which becomes somewhat depleted of carbon. When exposed to diamond growth conditions, these carbon-depleted free surface regions of the particulates are initially recarburized, and in the process of doing so form a stronger chemical bond with the deposited diamond. With the process of the invention it becomes feasible to adhere CVD diamond to WC with relatively small particulate dimensions and a low surface roughness, thus resulting in a smoother surface finish. Moreover, the resulting coated article also possesses the essential structural characteristics of the diamond/substrate interface which maximize crack deflection in order to prevent delamination of the diamond.

DETAILED DESCRIPTION

Figure 1:
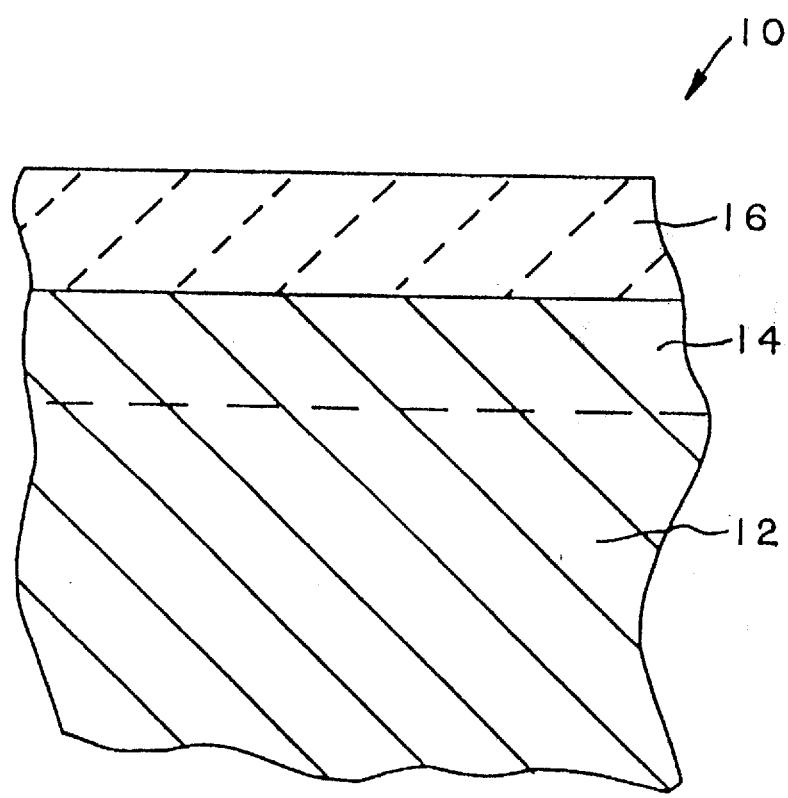
FIG. 1 is a schematic cross-sectional view of a fragment of a substrate of base material which has been coated with CVD diamond in accordance with one embodiment of the present invention.

By means of the process of the present invention, the chemical composition of the substrate/diamond interface is controlled to minimize deleterious binder phase-diamond reactions which can reduce the chemical bonding of the diamond film to the substrate and which can also induce a deleterious phase transformation of the diamond film to graphite. However, unlike techniques which remove the binder phase to some depth below the exposed WC-Co substrate surface, binder phase removal is done in a way which limits removal to only an area directly exposed to the CVD growth species, herein referred to as the "free surface."

The phase composition of the WC phase is controlled to maximize the density of direct chemical bonding between the diamond film and substrate. Unlike chemical etching methods, which de-carburize the WC grains by chemically attacking them, this decarburization is achieved without sacrificing the mechanical properties of the substrate or interface.

The process in accordance with the present invention permits control of the microstructural composition of the interface to minimize crack nucleation sites due to interfacial voids and to provide a toughening crack deflection mechanism which resists interfacial crack propagation. This feature essentially arrests or deflects cracks which may nucleate at the interface and impedes the propagation of these cracks to thereby suppress delamination of the diamond. The crack deflection mechanism is evolved without gross damage to the surface, such as results from abrading or blasting. Furthermore, the process of the present invention makes it feasible to use base material for the substrate which has a relatively small WC grain size, thereby resulting in a much smoother diamond coating surface, since the diamond coating surface profile tends to mirror that of the underlying substrate surface.

GENERAL FEATURES OF THE PROCESS

In accordance with the invention, an article 10, a fragment of which is shown in cross-seciton in FIG. 1 composed of commercially available WC-Co in its bulk region 12 with up to 10 wt % Co and having an average particle size in the range of from about 0.25 mm (millimeters) to 1.0 mm is sintered to form a cemented carbide article. The article may then be ground to a final desired geometry, which may include chip-forming or other complex surface features. The article is then treated at an elevated temperature in the presence of activated hydrogen, hydrocarbon, or inert gas in order to simultaneously a) vaporize the free surface binder phase, b) induce growth of the WC grains at the free surface, and c) shift the stoichiometry of the free surface WC grains to a carbon-deficient ratio without formation of the of the brittle eta phase of WC ($M_6C$, $M_{12}C$). The free surface thus produced is microstructurally roughened and cobalt-free, and the WC phase is de-carburized (with respect to bulk WC grains). An important feature of the process is that the WC grains within the bulk 12 are left essentially un-altered by the process. The substrate is then coated with a diamond film 16 of between 5 and 50 micrometers thick under temperature and time conditions which limit diffusion of the binder phase from a surface depth region 14 to the interface.

The novel process leaves the free surface of the substrate essentially free of the cobalt binder phase, as confirmed by analytical techniques such as energy dispersive spectroscopy (EDS). The removal of the binder phase from the free surface occurs through two mechanisms: a) some diffusion of cobalt atoms into the WC grains and b) vaporization and entrainment of the binder phase by process gases. Raising the temperature of the WC-Co material shifts the gas-liquid-solid equilibrium and produces a partial pressure of the metallic binder phase above the tool. Entraining this vapor by using an inert gas such as nitrogen or argon enables more surface cobalt to be vaporized. If the rate of vaporization is greater than the bulk-to-surface diffusion rate, the free surface will be essentially free of the binder phase. The temperature at which this process is carried out is a function of gas composition and gas velocity rate. For instance, if a dissociated hydrogen gas is used, vaporization occurs at a temperature below the standard melting point temperature of pure Co, which is 1495 degrees C. However, if nitrogen is used, the rapid grain growth and vaporization occurs at a temperature at or above the melting point temperature. At temperatures above the melting point of the binder phase, the growth process occurs rapidly. However, temperatures below the melting point temperature may be preferred to minimize any gravity-induced deformation of the article in its relatively soft state during processing.

During the early stages of the process, the WC grains at the free surface undergo common Ostwald ripening and re-crystallization. Following this, continued mass transport of W and C atoms result in grain-growth of the WC phase. However, while the conditions at the free surface support rapid grain growth of the surface WC grains, the grains within the bulk material grow at a much slower rate. For this reason, the important mechanical advantages of a fine-grained WC-Co material are retained within the bulk material. Under continued processing, the stoichiometery of the individual WC grains at the free surface is shifted in such a way that a stoichiometeric gradient exists on individual grains. Continued treatment or annealing under these conditions would eventually lead to the formation of the brittle eta-phase, which is a carbon-deficient W-C-Co phase, by essentially reducing the carbon concentration of WC grains at the free surface. The vaporization grain growth thermal de-carburization process of the present invention may be achieved under a range of processing conditions by varying time and temperature appropriately.

Following the evolution of the surface microstructure and chemical composition as described above, the surface is coated with a diamond film. During the initial stage of the CVD diamond nucleation or incubation period, carbon source gas re-carburizes the free surface WC grains and thus promotes direct chemical bonding between the diamond film and the WC grains at the interface. Diamond growth is thereby achieved under conditions which suppress bulk-to-interface diffusion of the binder phase.

EXAMPLE 1

A commercially available WC-Co cutting tool insert with 6 wt % Co binder, an average grain size of 0.5–1.0 mm, and a ground free surface was placed in a commercially-available vacuum-sintering graphite furnace. The sample was placed on a bed of graphite and SiC particles. The graphite was in the form of a graphite paint which covers a layer of SiC particulates. The graphite is present to suppress the formation of eta phase material. The SiC particles form a barrier between the insert and any supporting kiln furniture to prevent fusion of the insert to such furniture. The sample was heated to a temperature of 1560 deg. C. (Centigrade) in the presence of flowing nitrogen under a pressure of 0.30 torr for approximately 45 minutes and cooled to room temperature. The exact time, temperature and carbon concentration of the binder phase were controlled to promote the vaporization of the binder phase and the growth and de-carburization of the WC phase. These parameters are a function of batch size and geometry of the item being processed and can be readily ascertained by those skilled in the art. Following treatment, the free surface of the WC-Co article was characterized by EDS (energy dispersive spectrometery), XRD (x-ray diffraction), and SEM (scanning electron microscopy). EDS revealed the presence of W and the absence of Co at the surface. XRD revealed Co and WC with no formation of eta phase material. SEM showed free surface grain growth in the WC phase by extension of prismatic planes. The part was then coated with a 30 mm thick diamond film and tested by machining Reynold's A390 aluminum stock at 2500 surface feet per minute, 0.005 inches per revolution, and 0.025 inches depth of cut. The tool life was approximately 50% that of a PDC-tipped cutting tool insert subjected to a similar test. The tool failed by excessive wear, but not by delamination of the diamond film.

EXAMPLE 2

A commercially-available WC-Co cutting tool insert having 6 wt % Co, an average grain size of 0.5 mm–1.0 mm, and a ground free surface was placed in a dc arc-jet CVD diamond deposition system. The sample was placed in a holder which allows for accurate control of temperature and processing conditions during deposition as described in copending patent application Ser. No. 08/473,198 of J. Olson filed Jun. 7, 1995, entitled SPINNING SUBSTRATE HOLDER FOR CUTTING TOOL INSERTS FOR IMPROVED ARC-JET DIAMOND DEPOSITION and assigned to the same assignee as is the present invention. In the presence of dissociated hydrogen, the sample was heated to a temperature of between 1200° C. and 1350° C. in a pressure of about 5 torr. The surface of the WC-Co cutting tool insert was maintained in these conditions for a period of about 0.5 hours, during which a low concentration (approximately 0.10%) of methane was cycled on and off at 5 minute intervals. Diffusion transport (gettering) of the vaporized binder phase was controlled by the presence of a low temperature sink in close proximity to the processing inserts. The free surface was characterized by EDS, XRD and SEM as described above. EDS revealed the presence of W and absence of Co at the surface. XRD revealed Co and WC with no formation of the eta-phase. SEM showed free surface grain growth in the WC phase by extension of prismatic planes. The gas phase carbon, which is necessary to suppress the formation of eta-phase material, may also be supplied as a solid source by placing graphite in the pockets of the holder, for instance.

I claim:

1. A method of preparing the surface of a composite body of ceramic particulates embedded in a metal binder matrix material, comprising removing binder material from the free surface of the exposed particulates by gas-assisted vaporization in the presence of a carbon-rich ambient gas, the gas having a concentration such that the remaining binder rnear the surface becomes enriched in carbon in a surface thickness region while the exposed surface particulates become depleted of carbon, and simultaneously inducing recrystallization growth of the particulates at the free surface to result in a stoichiometric change in their surface region.

2. The method of claim 1 wherein the gas-assisted vaporization includes heating the body in a furnace in an atmosphere of predominantly inert gas at a pressure of between about 0.5 and about 2 torr.

3. The method of claim 2 wherein the atmosphere contains carbon vapor.

4. The method of claim 3 wherein the carbon source is a solid source within the vacumum furnace.

5. The method of claim 4 wherein the heating is for a period of between about 0.5 and 2.0 hours.

6. The method of claim 5 wherein the vaporization is carried out by treating the surface of the body with a plasma in an atmosphere of elemental hydrogen.

7. The method of claim 6 wherein the hydrogen is at a pressure of about 1 torr to about 100 torr.

8. The method of claim 7 wherein the plasma treatment is carried out in a plasma jet apparatus.

9. The method of claim 8 wherein the plasma treatment is carried out for about 0.5 hours and the temperature of the body is maintained at about 900 to 1600 degrees C.

10. The method of claim 9 wherein the plasma treatment is carried out by aplasma jet apparatus.

11. The method of claim 10 wherein the plasma jet apparatus is a d.c. arc. jet.

12. The method of claim 11 comprising coating the body with a diamond film in the same apparatus as is used for the plasma treatment.

13. The method of claim 12 wherein the plasma treatment is continued for about 0.5 hours and the temperature of the body is maintained at about 1350 to about 1450 degrees C.

14. The method of claim 13 wherein the plasma treatment is performed by a plasma jet.

15. The method of claim 14 wherein the plasma jet is a d.c. arc jet.

16. The method of claim 15 comprising coating the body with the diamond film in the same apparatus as is used for the plasma treatment.

17. The method of claim 16 wherein the edge of the body is honed prior to treatment.

18. The method of claim 17 wherein the edge of the body is chamfered prior to treatment.

* * * * *